United States Patent
Lee et al.

(10) Patent No.: US 7,598,663 B2
(45) Date of Patent: Oct. 6, 2009

(54) MULTI-WAVELENGTH LED PROVIDED WITH COMBINED FLUORESCENT MATERIALS POSITIONED OVER AND UNDERNEATH THE LED COMPONENT

(75) Inventors: Ming-Shun Lee, Taipei (TW); Chang-Wei Ho, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 353 days.

(21) Appl. No.: 11/196,431

(22) Filed: Aug. 4, 2005

(65) Prior Publication Data
US 2007/0029926 A1    Feb. 8, 2007

(51) Int. Cl.
*H05B 33/00* (2006.01)

(52) U.S. Cl. .................... 313/486; 313/512; 257/98
(58) Field of Classification Search ......... 313/482–487, 313/500–512; 257/98–100
See application file for complete search history.

(56) References Cited

U.S. PATENT DOCUMENTS

| | | | |
|---|---|---|---|
| 6,791,116 B2* | 9/2004 | Takahashi et al. | 257/79 |
| 2003/0002272 A1* | 1/2003 | Suehiro et al. | 362/84 |
| 2004/0164311 A1* | 8/2004 | Uemura | 257/99 |
| 2004/0217692 A1* | 11/2004 | Cho et al. | 313/503 |
| 2005/0280354 A1* | 12/2005 | Liu | 313/502 |
| 2006/0012298 A1* | 1/2006 | Lee et al. | 313/512 |
| 2007/0080636 A1* | 4/2007 | Lee | 313/512 |

* cited by examiner

*Primary Examiner*—Mariceli Santiago
(74) *Attorney, Agent, or Firm*—Troxell Law Office PLLC

(57) ABSTRACT

A multi-wavelength LED construction and its manufacturing process having respectively coated on the base layer and the position above the peripheral of the light emitting chip a fluorescent material of a specific wavelength to be excited to provide higher light emitting efficiency and expected light color without mutual interference when the chip is conducted so to facilitate quality control of the multi-wavelength LED.

3 Claims, 5 Drawing Sheets

MULTI-WAVELENGTH LED PROVIDED WITH COMBINED FLUORESCENT MATERIALS POSITIONED OVER AND UNDERNEATH THE LED COMPONENT

BACKGROUND OF THE INVENTION (a) Field of the Invention

The present invention is related to an art of presenting LED light emitting efficiency and light color, and more particularly, to a multi-wavelength LED construction and its manufacturing process that produce highly light emitting efficiency and accurate gloss.

(b) Description of the Prior Art

As illustrated in FIG. 1 for a schematic view of a basic construction of a multi-wavelength LED of the prior art, a chip mounting gel 40 is used to place a light-emitting chip 10 in a bowl shaped carrier 20; a golden plated wire 30 constitutes the connection between the blue light emitting chip 10 and two electrodes 21; and a fluorescent gel 50 containing fluorescent powders is applied to cover up the light-emitting chip 10. When the light-emitting chip 10 is conducted, the fluorescent powders in the fluorescent gel 50 are excited by the light source from the light-emitting chip 10 to emit the light in an expected color.

Generally, a blue chip is used in the multi-wavelength LED to excite yellow fluorescent powders 51 mixed in the fluorescent gel 50 to produce pseudo-white light that looks light white light. However, the prior art relies upon only fluorescent powders in a straight color as the complementary light excited by the light-emitting chip, the resultant pseudo-white gloss is poor and blamed for yellow halo phenomenon. To correct, two types of fluorescent powders in different colors are mixed in the fluorescent gel for the multi-wavelength LED. Usually, a blue chip is used to excite red fluorescent powders 52 and green fluorescent 53 mixed in the fluorescent gel 50 for the red light and the green light to incorporated with the blue light of the light-emitting chip 10 for obtaining RGB mixing results to produce the light color that is with higher color development properties and closer to the white light. However, the amount and proportion of the fluorescent powders in different colors prevent easy control for effective control of the quality of the finished product; and interference exists due to that different colors of fluorescent powders are excited at the same position at the same time by the light source from the light-emitting chip. That is, the energy for the fluorescent powder of shorter wavelength will be absorbed by that of longer wavelength to prevent estimate of their consumption ratio, and thus to fail the expected color deflection for presenting the accurate expected light color. Furthermore, the fluorescent powder of shorter wavelength emits light of slightly longer wavelength which in turn excites the fluorescent powder to emit light of even longer wavelength thus to compromise the light emitting efficiency to produce light at lower luminance.

SUMMARY OF THE INVENTION

The primary purpose of the present invention is to provide a construction of a multi-wavelength LED and its manufacturing process to provide higher light emitting efficiency and expected light color without mutual interference when the chip is conducted so to facilitate quality control of the multi-wavelength LED. To achieve the purpose, the present invention has respectively coated on the base layer and the position above the peripheral of the light emitting chip a fluorescent material of a specific wavelength to be excited allowing easy control of the amount and ratio of the fluorescent powders at different positions.

DETAILED DESCRIPTION OF THE PREFERRED EMBODIMENTS

Figure 1:
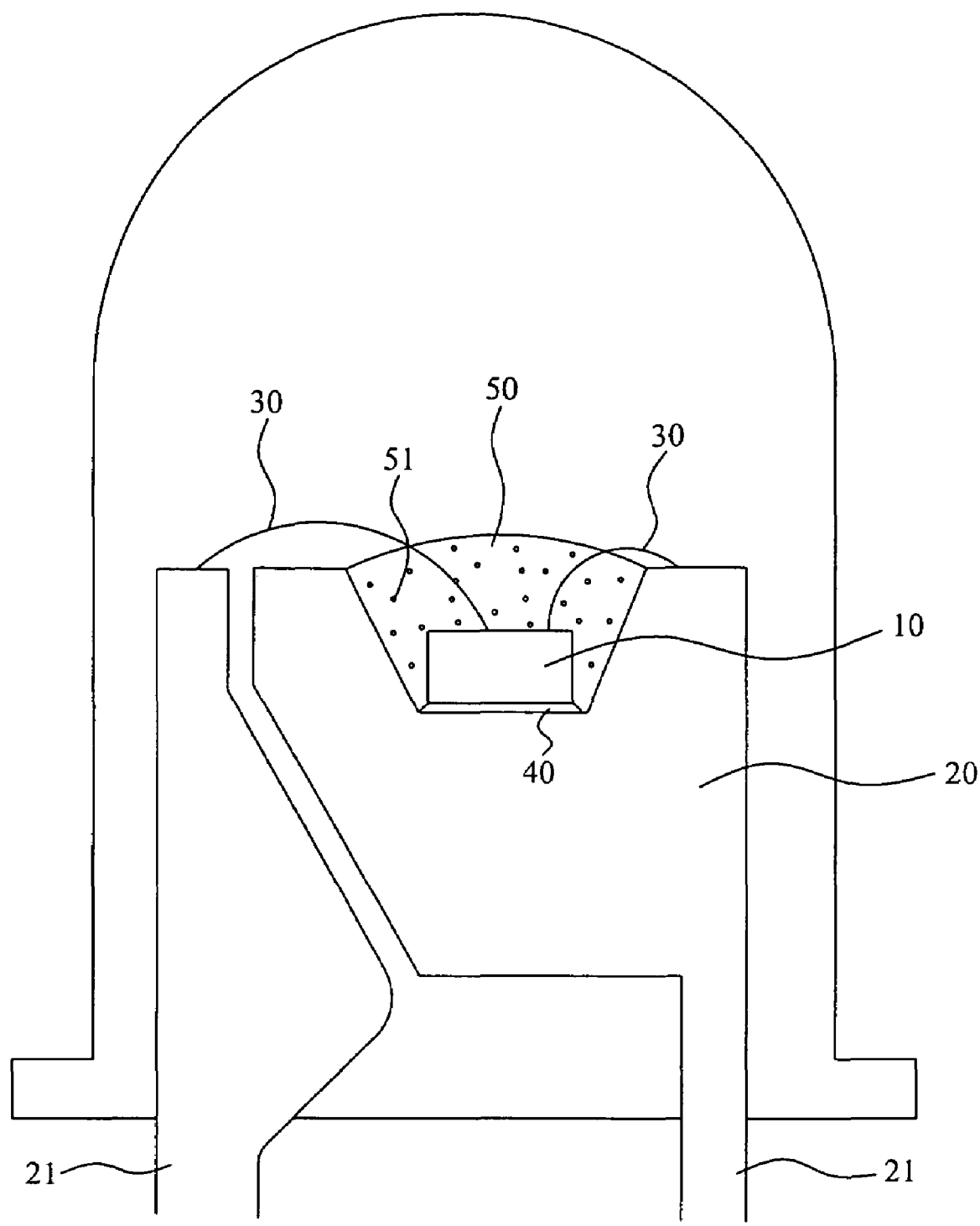
FIG. 1 is a schematic view showing a construction of a multi-wavelength LED of the prior art.
Figure 2:
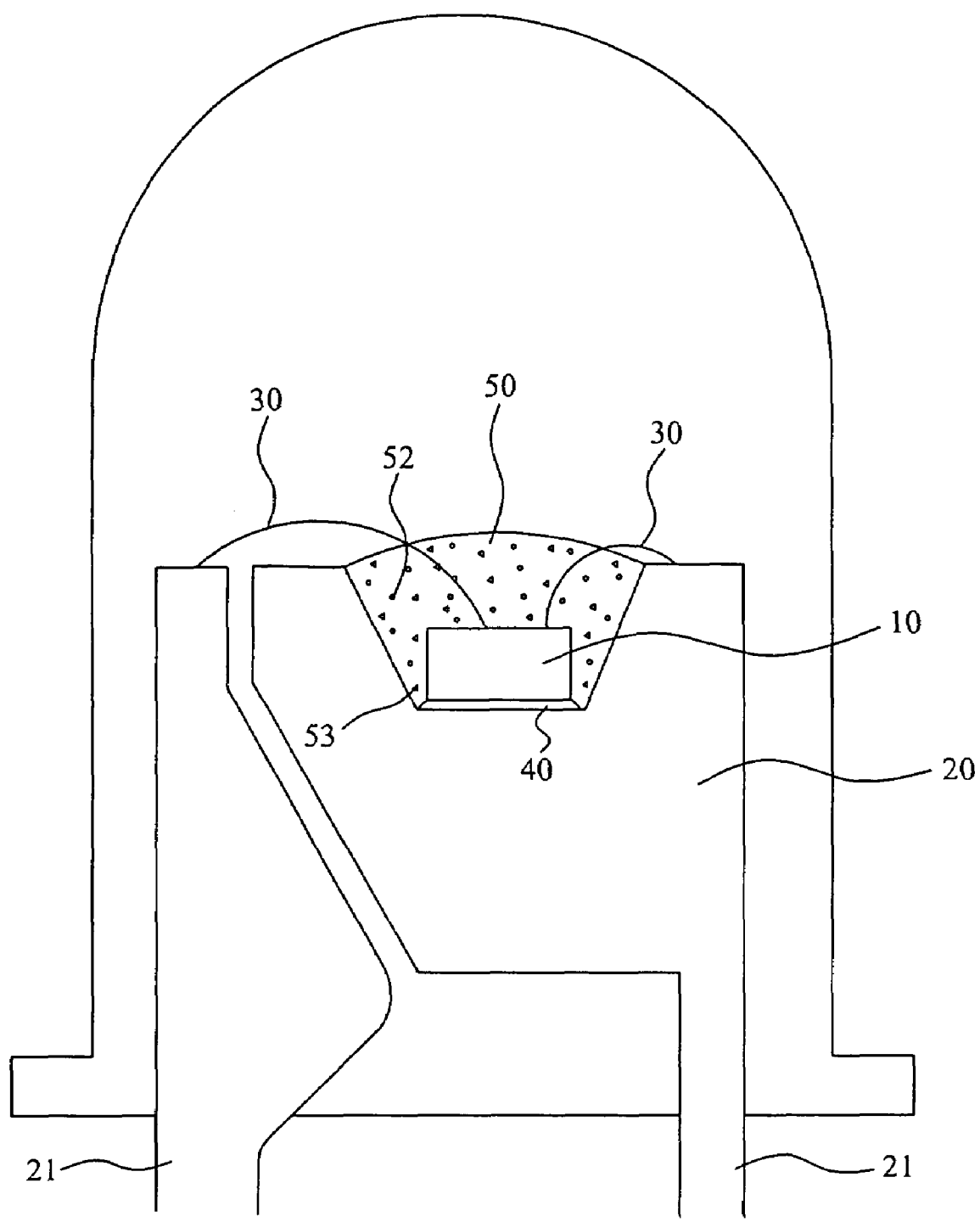
FIG. 2 is a schematic view showing a construction of a multi-wavelength LED of another prior art.
Figure 3:
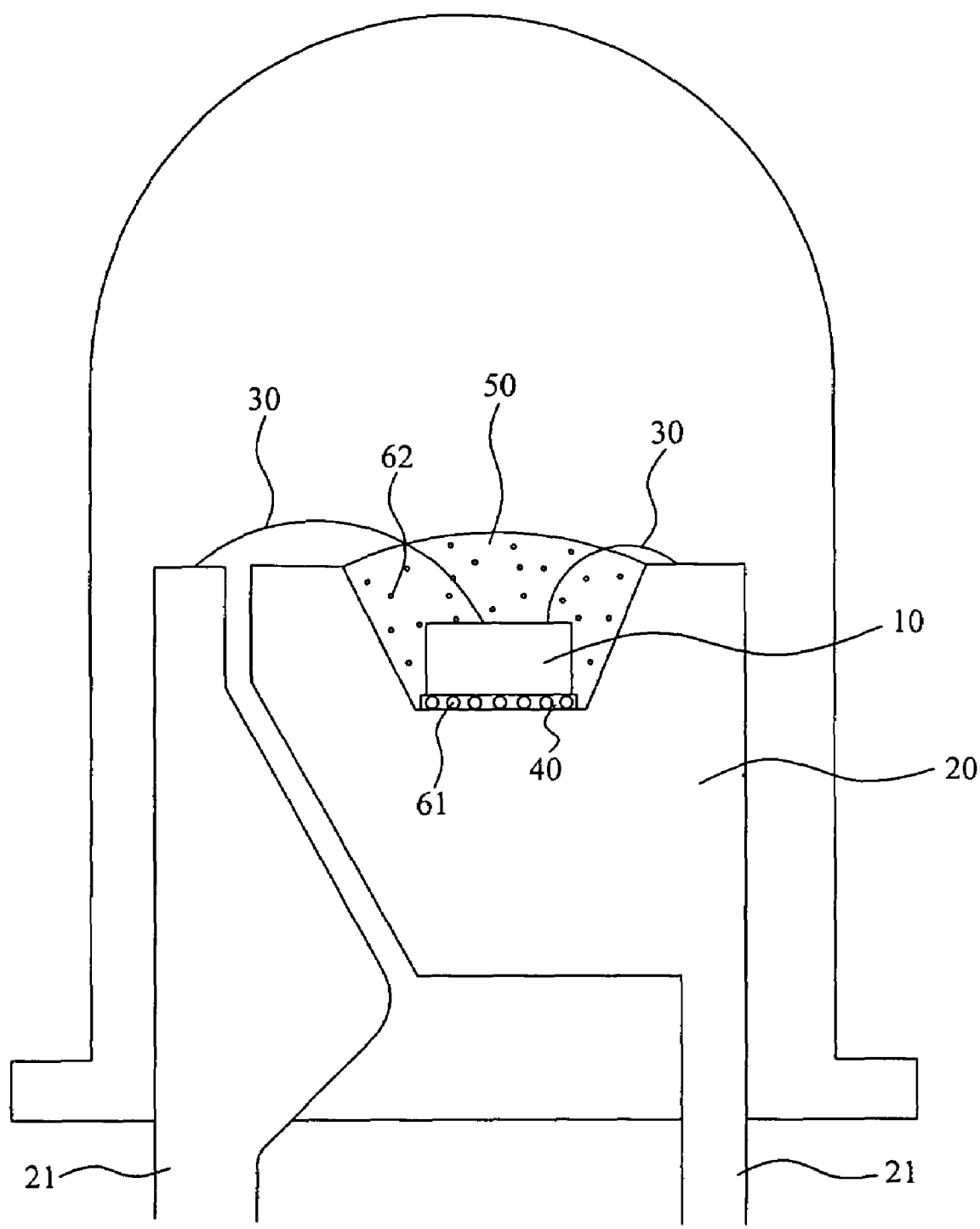
FIG. 3 is a schematic view showing a construction of a multi-wavelength LED of a first preferred embodiment of the present invention.

Referring to FIG. 3, a first preferred embodiment of the present invention, a construction of a multi-wavelength LED has a chip mounting gel 40 to place a light-emitting chip 10 in a carrier 20; a golden plated wire 30 constitutes the connection between the blue light emitting chip 10 and two electrodes 21; and a fluorescent gel 50 containing fluorescent powders is applied to cover up the light-emitting chip 10. When the light-emitting chip 10 is conducted, the fluorescent powders in the fluorescent gel 50 are excited by the light source from the light-emitting chip 10 to emit the light in an expected color.

Wherein, the base layer and the peripheral of the light-emitting chip 10 are respectively coated with one or a plurality of fluorescent material of a given wavelength. When the light-emitting chip is conducted, the fluorescent materials are respectively excited to emit the light with expected color without mutual interference. The process not only achieves the higher light emitting efficiency and correct color of light emitted, but also allows easy control of the amount and proportion of the fluorescent materials at different positions to facilitate the quality control of the multi-wavelength LED and significantly increase its production capacity.

Figure 4:
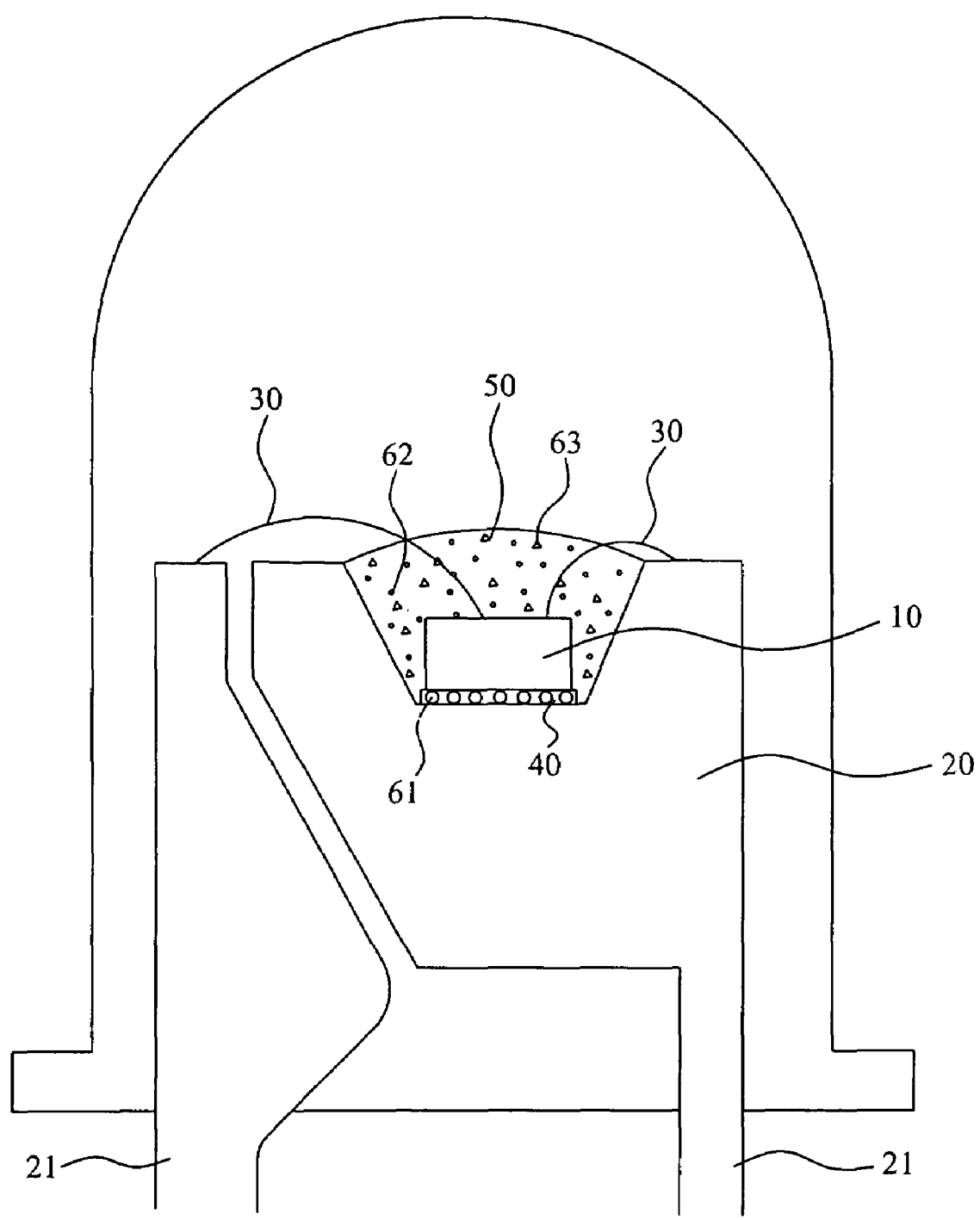
FIG. 4 is a schematic view showing a construction of a multi-wavelength LED of a second preferred embodiment of the present invention.
Figure 5:
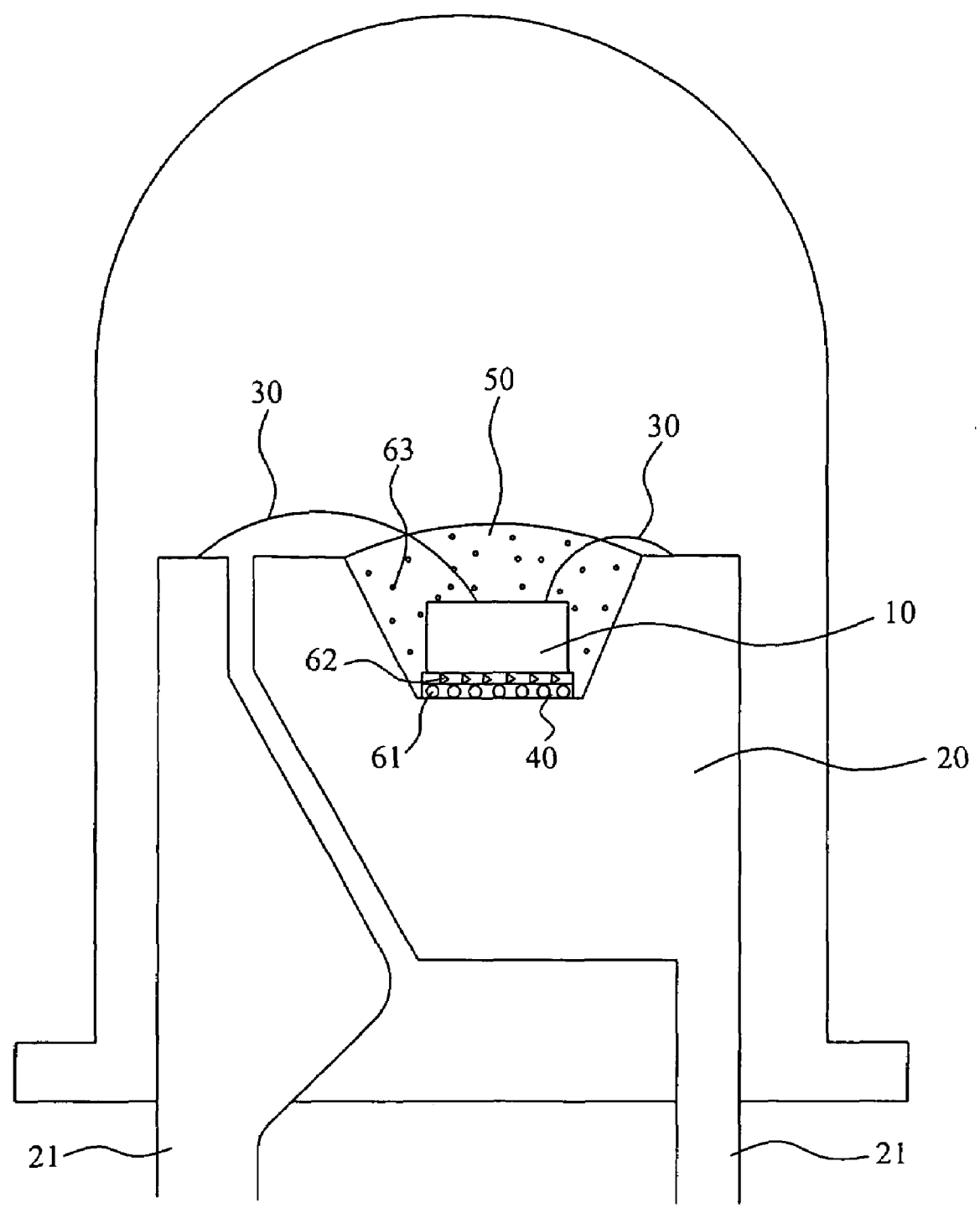
FIG. 5 is a schematic view showing a construction of a multi-wavelength LED of a third preferred embodiment of the present invention.

FIGS. 3, 4 and 5 show three constructional types of the present invention. As illustrated in FIG. 3, a first preferred embodiment of the present invention has at the base layer of the light-emitting chip 10 (the position of the chip mounting gel 40 as illustrated) is covered up with a first fluorescent material 61 of comparatively longer wavelength, and the position above the peripheral of the light-emitting chip 10 (the position of the fluorescent gel 50 as illustrated) is covered up with a second type of the fluorescent material 62 of comparatively shorter wavelength. In practice, the light-emitting chip 10 relates to a blue chip and its base layer is covered up with red fluorescent material while the position above the peripheral of the light-emitting chi 10 is covered up with green fluorescent material to constitute a light-emitting diode of white light. The manufacturing process of the first preferred embodiment has the first fluorescent material of comparatively longer wavelength mixed with the gel to become the chip mounting gel. The fluorescent gel is then coated on the carrier of the light-emitting chip. The light-emitting chip is secured in the chip mounting gel and baked in position. The golden plated wire connects the light-emitting chip and the electrodes. The second type of fluorescent material of the comparatively shorter wavelength is also mixed with the gel to become a fluorescent gel. The gel is poured into the position above the peripheral of the light-emitting chip and baked in the oven.

As illustrated in FIG. 4, a second preferred embodiment of the present invention has the base layer of the light-emitting chip 10 (the position of the chip mounting gel 40 as illustrated) covered with the first type of fluorescent material 61 of a comparatively longer wavelength, and the position above the peripheral of the light-emitting chip 10 (the position of the fluorescent gel 50 as illustrated) is covered with a second and a third types of fluorescent materials 62, 63 each of a comparatively shorter wavelength. Wherein, the wavelength of the third type of fluorescent material 63 is shorter than that of the first type and longer than that of the second type of fluorescent materials 61,62. In practice, the light-emitting chip 10 relates to a blue chip. The base layer of the light-emitting chip is covered with red fluorescent material, and the position above the peripheral of the light-emitting chip is covered with green and yellow fluorescent materials to constitute a white light-emitting diode. In the manufacturing process of the second preferred embodiment of the present invention, the first type of the fluorescent material of comparatively longer wavelength is mixed with the gel to become the chip mounting gel to be coated in the carrier of the light-emitting chip. The golden plated wire connects the light-emitting chip and the electrodes. The second and the third types of fluorescent materials each of the comparatively shorter wavelength are also mixed with the gel to become a fluorescent gel. The gel is poured into the position above the peripheral of the light-emitting chip and baked in the oven.

A third preferred embodiment of the present invention as illustrated in FIG. 5 has the base layer of the light-emitting chip 10 (the position of the chip mounting gel 40 as illustrated) covered with the first and the second types of fluorescent material 61, 62 each of a comparatively longer wavelength, and the position above the peripheral of the light-emitting chip 10 (the position of the fluorescent gel 50 as illustrated) is covered with a third type of fluorescent material 63 of comparatively shorter wavelength. Wherein, the wavelength of the third type of fluorescent material 63 is shorter than that of the first type 61 and longer than that of the second type of fluorescent material 62. In practice, the light-emitting chip 10 relates to a blue chip. The base layer of the light-emitting chip is covered with red and yellow fluorescent materials, and the position above the peripheral of the light-emitting chip is covered with green fluorescent material to constitute a white light-emitting diode. In the manufacturing process of the third preferred embodiment of the present invention, the first and the second types of the fluorescent materials each of comparatively longer wavelength are mixed with the gel to become the chip mounting gel to be coated in the carrier of the light-emitting chip. The golden plated wire connects the light-emitting chip and the electrodes. The third type of fluorescent material of the comparatively shorter wavelength is also mixed with the gel to become a fluorescent gel. The gel is poured into the position above the peripheral of the light-emitting chip and baked in the oven.

Alternatively, the first and the second fluorescent materials each of longer wavelength are respectively mixed with the gel to produce separate gel cakes. Both gel cakes are then respectively baked in the oven with the chip to produce separate semi-products. Both semi-products are then placed in the carrier of the light-emitting chip and baked in sequence. The golden plated wire connects the light-emitting chip and the electrodes. The third type of fluorescent material of the comparatively shorter wavelength is also mixed with the gel to become a fluorescent gel. The gel is poured into the position above the peripheral of the light-emitting chip and finally baked in the oven.

The prevent invention provides an improved construction of a multi-wavelength LED and its manufacturing process, and this application is duly filed accordingly. However, it is to be noted that that the preferred embodiments disclosed in the specification and the accompanying drawings are not limiting the present invention; and that any construction, installation, or characteristics that is same or similar to that of the present invention should fall within the scope of the purposes and claims of the present invention.

We claim:

1. A multi-wavelength LED has a base layer of a light-emitting chip covered with a first and a second types of fluorescent materials each of comparatively longer wavelength and a position above the peripheral light-emitting chip covered with a third type of fluorescent material of comparatively shorter wavelength, wherein the wavelength of the second type of fluorescent material is shorter than that of the first type and longer than that of the third type of fluorescent materials.

2. The multi-wavelength LED of claim 1, wherein the light-emitting chip relates to a blue chip; the base layer of the light-emitting chip is covered with red and yellow fluorescent materials; and the position above the light-emitting chip is covered with green fluorescent material.

3. The multi-wavelength LED of claim 1, wherein the second type of fluorescent material is a second layer directly overlying a first layer of the first type of fluorescent material.

* * * * *